US005150282A

United States Patent [19]
Tomura et al.

[11] Patent Number: 5,150,282
[45] Date of Patent: Sep. 22, 1992

[54] ELECTROMAGNETIC SHIELDING STRUCTURE OF HIGH-FREQUENCY CIRCUIT ARRANGEMENTS

[75] Inventors: Masashi Tomura; Hisamitsu Takagi, both of Kawasaki, Japan

[73] Assignee: Fujitsu Limited, Kawasaki, Japan

[21] Appl. No.: 764,724

[22] Filed: Sep. 24, 1991

[30] Foreign Application Priority Data

Dec. 14, 1990 [JP] Japan ................. 2-410590

[51] Int. Cl.$^5$ ............................................. H05K 9/00
[52] U.S. Cl. ................................... 361/424; 361/395; 455/300; 174/35 R; 174/35 MS
[58] Field of Search ............ 361/390, 391, 395, 399, 361/422, 424; 455/300, 301; 174/35 R, 35 MS

[56] References Cited

U.S. PATENT DOCUMENTS

| | | | |
|---|---|---|---|
| 4,736,266 | 4/1988 | Tanibe | 361/424 |
| 4,794,489 | 12/1988 | Brown | 361/424 |
| 4,890,199 | 12/1989 | Beutler | 361/424 |
| 5,045,973 | 9/1991 | Saarela et al. | 361/395 |

FOREIGN PATENT DOCUMENTS 62-199098 9/1987 Japan .

*Primary Examiner*—Leo P. Picard
*Assistant Examiner*—Bot L. Ledynh
*Attorney, Agent, or Firm*—Staas & Halsey

[57] ABSTRACT

An electromagnetic shielding structure of high-frequency circuit arrangements which is capable of electromagnetically shielding each high-frequency functional circuit within a narrow space. A printed-circuit board mounted with a plurality of high-frequency functional circuits is installed in the shielding case. Ribs with a long groove are formed on the inside surface of a molded plastic casing which has been treated to provide electrical conductivity, for separating the high-frequency functional circuits mounted on the printed-circuit board. In the long groove of the ribs is pressed a shielding member, and with the printed-circuit board assembled between the shielding case and the molded plastic casing, the top end of the shielding member is pressed against a ground pattern of the printed-circuit board.

4 Claims, 5 Drawing Sheets

FIG.5
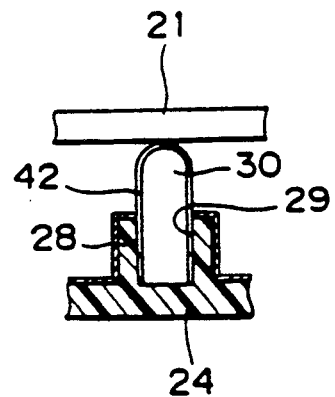
FIG.6A
FIG.6B
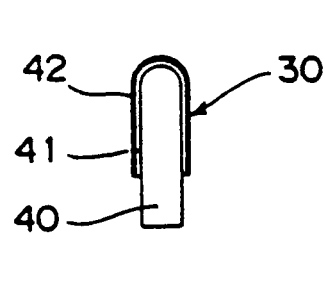
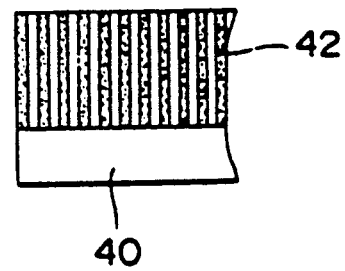
FIG.7
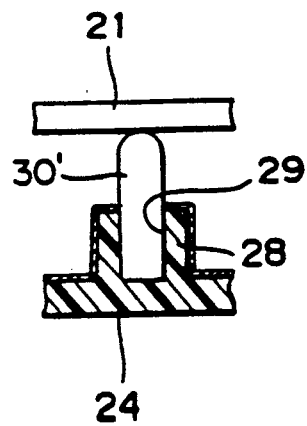

ELECTROMAGNETIC SHIELDING STRUCTURE OF HIGH-FREQUENCY CIRCUIT ARRANGEMENTS

BACKGROUND OF THE INVENTION

1. Field of the Invention

The present invention relates to an electromagnetic shielding structure of high-frequency circuit arrangements for car telephones, portable telephones, etc.

2. Description of the Prior Art

The ultimate object of communication is to enable immediate transmission or exchange of a telephone-user's will or information at any time, from any place, and to any person called up. Mobile communication, therefore, is gradually increasing, in addition to conventional communication between stationary points. The mobile communication is adopted for communication between telephones on moving bodies such as ships, automobiles, aircraft, etc. and stationary telephones such as a general subscriber's telephone and an office telephone, and between telephones on moving bodies such as a car telephone, a portable telephone, a cordless telephone, etc.

Wireless apparatus for example portable telephones stated above use an around 800 to 900 MHz high-frequency band called a quasi-microwave band. In such functional circuits as transmitting and receiving circuits using high frequencies formed on the same printed-circuit board, there occur various troubles caused by electromagnetic interference between the functional circuits. It is, therefore, desired that an electromagnetic shielding structure be used for the high-frequency circuit arrangements for the purpose of preventing troubles resulting from such an electromagnetic interference.

FIG. 1 is an exploded perspective view showing an electromagnetic shielding structure of conventional high-frequency circuit arrangements. In this drawing, reference numeral 2 refers to a printed-circuit board on which are mounted a plurality of high-frequency functional circuits such as receiving and transmitting circuits. Reference numeral 4 denotes a lower shielding case formed from an aluminum die casting, and numeral 10 an upper shielding case formed similarly from an aluminum die casing. In the outer periphery of the lower shielding case is formed a groove 6, and further formed are ribs 8 for separating the high-frequency functional circuits.

Reference numeral 12 represents a shielding wire produced of a metal, which is fitted in the groove 6 formed in the outer peripheral wall of the lower shielding case 4. Furthermore, plate springs 14 are installed to the ribs 8 of the lower shielding case 4.

With the shielding wire 12 fitted in the groove 6 of the lower shielding case 4 and with the plate springs 14 installed to the ribs 8, the printed-circuit board 2 is fastened by a plurality of screws 16 between the lower shielding case 4 and the upper shielding case 10. In this state the plate springs 14 are pressed against a ground pattern of the printed-circuit board 2, thereby realizing the electromagnetic shielding between the high-frequency functional circuits formed on the printed-circuit board 2.

In the conventional electromagnetic shielding structure described above, it is necessary to provide ribs in the inserting sections for the purpose of inserting the metallic shielding wires into the grooves formed in the case. Since the plate springs for grounding are pressed against the ground pattern of the printed-circuit board to insure electromagnetic shielding between the high-frequency functional circuits, the plate springs become complicated in configuration. Furthermore the conventional electromagnetic shielding structure has the problem that the electromagnetic shield can not be used within a narrow space in high-frequency circuit arrangements of high-density mounting.

SUMMARY OF THE INVENTION

It is, therefore, an object of the present invention to provide a shielding structure for high-frequency circuit arrangements capable of electromagnetically shielding each high-frequency functional circuit in a narrow space.

In accordance with an aspect of the present invention, there is provided an electromagnetic shielding structure for high-frequency circuit arrangements, which includes a mounting member with at least the surface treated to provide electrical conductivity; a printed-circuit board having a ground pattern attached on the mounting member, the printed-circuit board having a plurality of high-frequency functional circuits arranged thereon; a molded plastic casing for containing the mounting member and the printed-circuit board installed thereon with its inside surface treated for electrical conductivity; a plurality of ribs formed integral with the inside surface of the molded plastic casing, for separation of the high-frequency functional circuits arranged on the printed-circuit board, the ribs having a long groove; and a shielding member pressed in the long groove of the rib. The shielding member is a flexible solid member, at least its surface having electrical conductivity and the forward end of the shielding member being adapted to be pressed against to the ground pattern of the printed-circuit board to electromagnetically shield each high-frequency functional circuit.

The shielding member is preferably to be formed of carbon-filled rubber, or rubber lined with a metal foil over the surface.

The above and other objects, features and advantages of the present invention and the manner of realizing them will become more apparent, and the invention itself will best be understood from a study of the following description and appended claims with reference to the attached drawings showing some preferred embodiments of the invention.

BRIEF DESCRIPTION OF THE DRAWINGS

FIG. 5 is an enlarged view of A portion of FIG. 4;

FIG. 6A is a front view showing the constitution of a shielding member of FIG. 5;

FIG. 6B is a side view thereof; and

FIG. 7 is a view showing another example of the shielding member though similar to FIG. 5.

DESCRIPTION OF THE PREFERRED EMBODIMENTS

Figure 1:
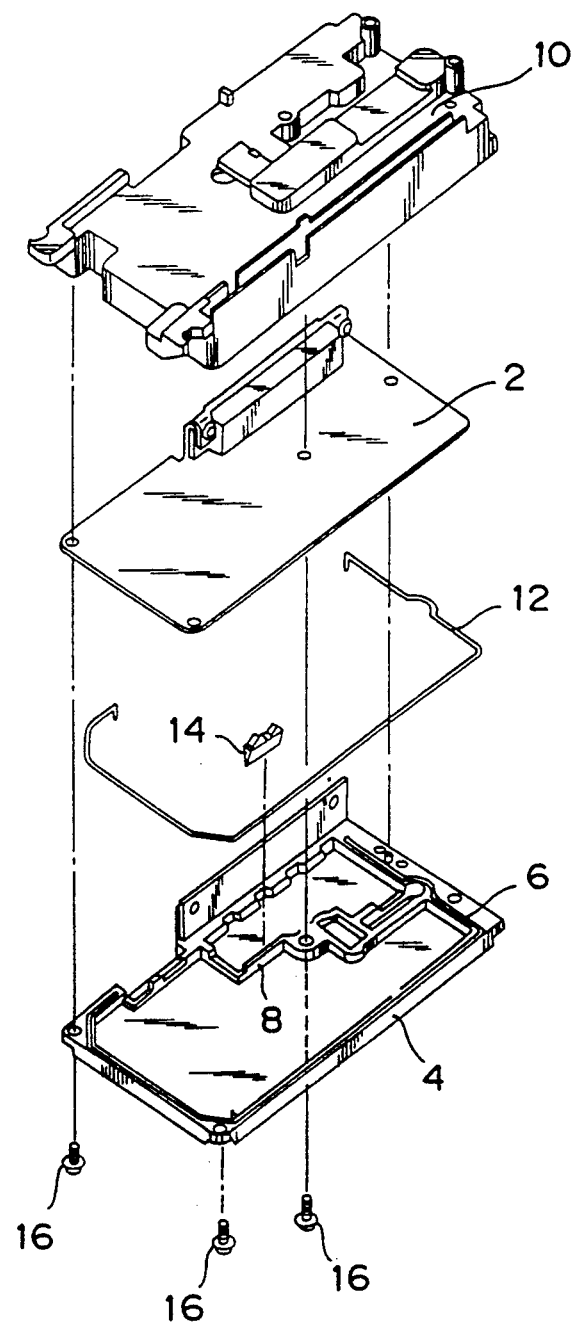
FIG. 1 is an exploded perspective view of a conventional electromagnetic shielding structure.
Figure 2:
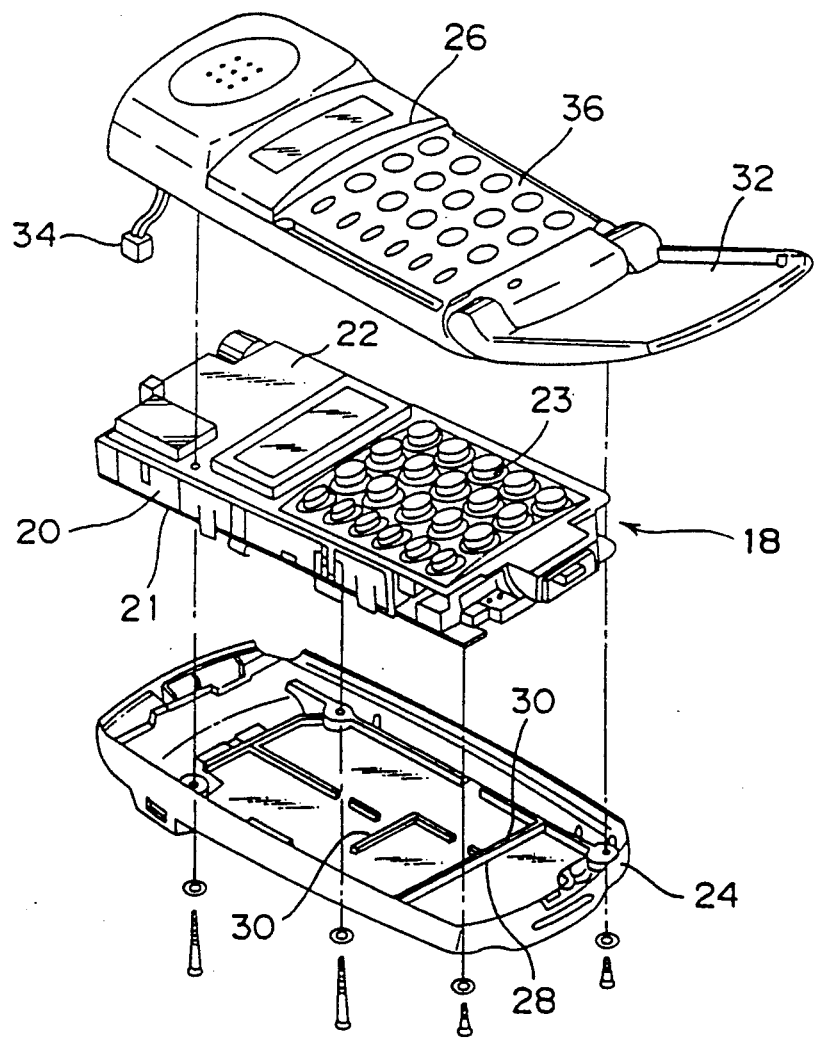
FIG. 2 is an exploded perspective view of a portable telephone using the electromagnetic shielding structure according to the present invention.

FIG. 2 is an exploded perspective view of a portable telephone using a preferred embodiment of an electromagnetic shielding structure according to the present invention. Reference numeral 18 denotes a module which houses a radio unit and a control unit as one body comprising a printed-circuit board 21 mounted with a plurality of high-frequency functional circuits and another printed-circuit board 22 mounted with a logic circuit both of which are mounted on a shielding case 20. On the printed-circuit board 22 is installed a key top sheet 23. The shielding case 20 is formed of a molded plastic material, the surface of which has been treated to provide electrical conductivity by metal film deposition or plating.

Figure 3:
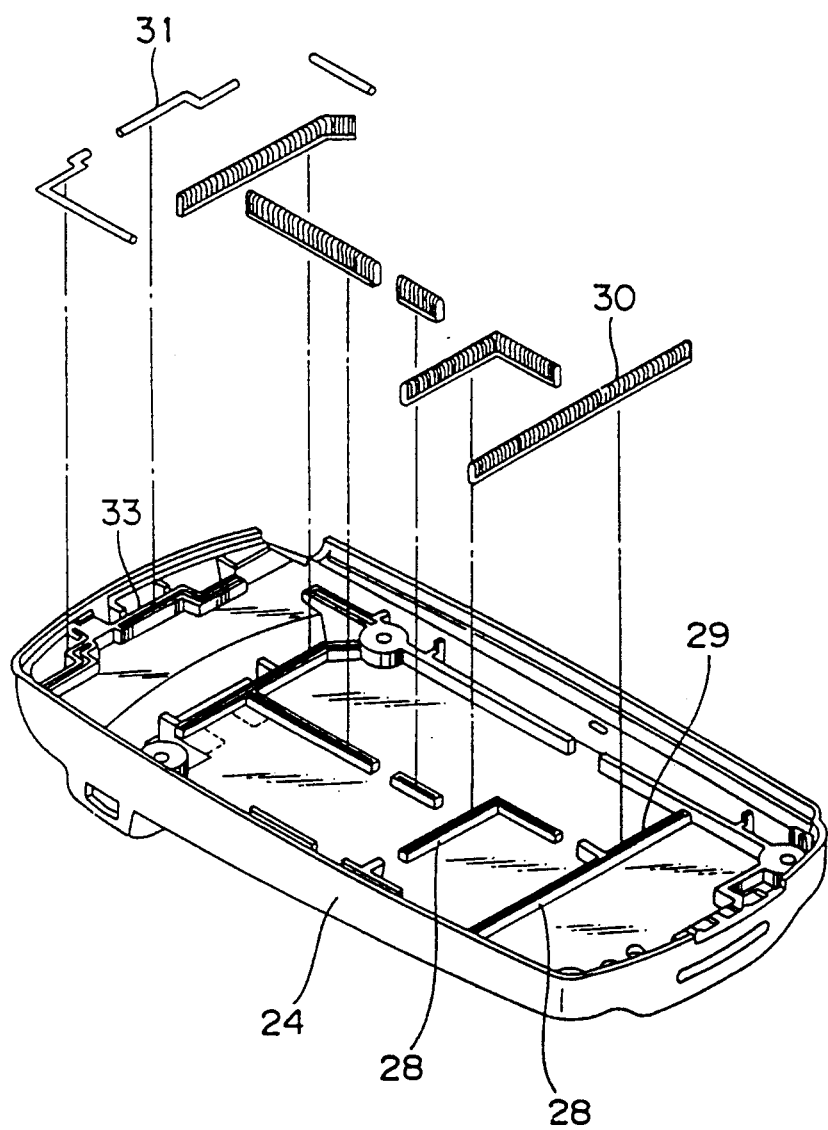
FIG. 3 is an exploded perspective view showing the method of mounting a shielding member to a rear casing.

Reference numeral 24 denotes a rear casing formed of a molded plastic material, on the inside surface of which are integrally formed a plurality of ribs 28 for separating the high-frequency functional circuits mounted on the printed-circuit board 21. Each of the ribs 28 has a long groove 29 formed as shown in FIG. 3. In the long groove 29 of the rib 28 is pressed a shielding member 30. Furthermore, a shielding wire 31 is inserted in the long groove formed in the rib 33 of the rear casing 24. The inside surface of the rear casing is treated for electric conductivity by a metal film deposition or plating.

Reference numeral 26 denotes a front casing formed of the same molded plastic material. Its inside surface also is deposited or plated with a metal film to provide electrical conductivity. Reference numeral 36 is a switch panel for covering the key top sheet 23, and a protective cover 32 serving also for collecting sound is rotatably mounted for protection of the switch section in the front casing 26. Reference numeral 34 denotes a connector for earphone connection.

A portable telephone is assembled as a unit by sandwiching the module 18 integrally containing a radio unit and a control unit between the rear casing 24 and the front casing 26 with four screws.

Figure 4:
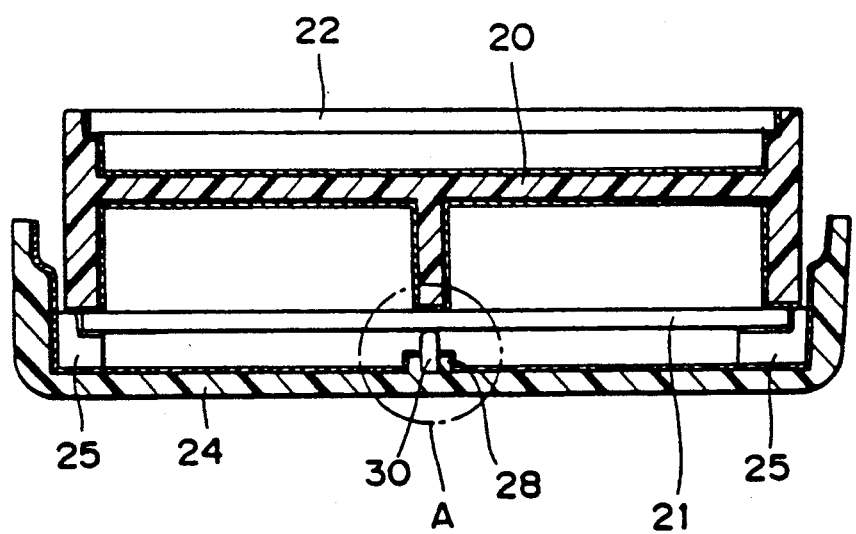
FIG. 4 is a schematic sectional view of an embodiment of an electromagnetic shielding structure according to the present invention.

In the following, the embodiment of the electromagnetic shielding structure according to the present invention will be explained in detail with reference to FIGS. 4 to 7. Referring first to FIG. 4 showing a schematic sectional view of the embodiment according to the present invention, the printed-circuit board 21 mounted with a plurality of high-frequency functional circuits such as a receiver and a transmitter and the printed-circuit board 22 mounted with a logic circuit are installed on the shielding case 20 with the surface thereof treated to provide electrical conductivity. These printed-circuit boards 21 and 22 are multilayer printed-circuit boards, in which a ground layer of a specific pattern is inserted. Because of this ground layer the printed-circuit boards serve also as an electromagnetic shield.

The rear casing 24 is provided with a support rib 25 formed as one body. On this support rib 25 is mounted the printed-circuit board 21. This printed-circuit board 21 mounted with the high-frequency functional circuits is fully enclosed with the shielding case 20 and the rear casing 24. On a conductive film surface of the rib 25 and on the surface of the printed-circuit board 21 set in contact with this film surface, there is formed ground patterns connected to the ground layer of the printed-circuit board, the enclosed space being protected thereby from outside in terms of high-frequency interference. In FIG. 4 the front casing is not illustrated. With the portable telephone assembled by screws as shown in FIG. 2, the shielding member 30 press-fitted in the long groove of the rib 28 of the rear casing 24 is pressed against the ground pattern formed along the shielding member 30 on the surface of the printed-circuit board 21, thereby enabling the electromagnetic shielding of one high-frequency functional circuit from other high-frequency functional circuits.

FIG. 5 is an enlarged view of the A portion in FIG. 4, in which the shielding member 30 deposited with a copper foil 42 on the surface is press fitted in the long groove 29 of the rib 28 of the rear casing 24. The top end of the shielding member 30 is pressed against the ground pattern of the printed-circuit board 21 mounted with the high-frequency functional circuits.

Referring to now FIGS. 6A and 6B, the constitution of the shielding member 30 will be explained. The shielding member 30 is made up by affixing, on a silicone sponge rubber 40, a polyimide film 41 with a copper foil 42 formed on the surface. The copper foil 42 is gold-plated on the surface. The shielding member is manufactured, for example, as follows. A uniform copper foil is formed on the surface of the polyimide film 41 and then gold-plated. Then, the copper foil is subjected to etching to provide a stripe-like pattern as shown in FIG. 6B. A soft silicone rubber or other synthetic rubber is usable for the silicone sponge rubber 40.

Furthermore, after application of a primer to the back side of the polyimide film 41, the polyimide film 41 is set in a mold with the back side up, and then a form silicone rubber is charged into the mold. The foam silicone rubber 40 thus charged into the mold adheres to the polyimide film 41, forming the shielding member 30 as shown in FIGS. 6A and 6B. Forming the copper foil 42 into the aforesaid stripe-like pattern is primarily for the purpose of providing a flexible shielding member 30. Furthermore, the copper foil, being discontinued, can attach or contact the counter surface well.

FIG. 7 shows another embodiment according to the present invention using a shielding member 30' of other constitution. The shielding member 30' is formed of carbon-filled silicone rubber, which contains 30 to 50, preferably about 40, weight percent of carbon. It has been confirmed that the shielding member 30' formed of the carbon-filled silicone rubber is lower in price than the shielding member 30 having the copper foil on the surface, and has adequate electromagnetic shielding performance.

According to the electromagnetic shielding structure of the present invention described above, it is possible to easily attach the shielding member to the casing and also to fully electromagnetically shield each high-frequency functional circuit within a narrow space.

What is claimed is:

1. An electromagnetic shielding structure of high-frequency circuit arrangements, comprising:
   a mounting member at least the surface of which has been treated to provide electrical conductivity;
   a printed-circuit board having a ground pattern installed on said mounting member, said printed-circuit board being mounted with a plurality of high-frequency functional circuits;
   a molded plastic casing the inside surface of which has been treated to provide electrical conductivity, for housing said mounting member and said printed-circuit board mounted thereon;

a plurality of ribs formed integral with said inside surface of said molded plastic casing, for separating said high-frequency functional circuits mounted on said printed-circuit board, said ribs having a long groove; and a shielding member pressed in said long groove of said ribs, said shielding member being a flexible solid material at least the surface of which is electrically conductive, and the top end of said shielding member being pressed against said ground pattern of said printed-circuit board to electromagnetically shield each of said high-frequency functional circuits.

2. The electromagnetic shielding structure of high-frequency circuit arrangements as defined in claim 1, wherein said shielding member is formed of carbon-filled rubber.

3. The electromagnetic shielding structure of high-frequency circuit arrangements as defined in claim 1, wherein said shielding member is formed of rubber laid with a metal foil on the surface.

4. The electromagnetic shielding structure of high-frequency circuit arrangements as defined in claim 3, wherein said metal foil has a stripe-like pattern.

* * * * *